United States Patent
Li et al.

(10) Patent No.: US 8,957,581 B2
(45) Date of Patent: Feb. 17, 2015

(54) ORGANIC LIGHT EMITTING DIODE DISPLAY

(71) Applicant: Innolux Corporation, Miao-li County (TW)

(72) Inventors: Chun-Kai Li, Miao-Li County (TW); Hsin-Yuan Su, Miao-Li County (TW); Hsiang-Lun Hsu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 13/789,726

(22) Filed: Mar. 8, 2013

(65) Prior Publication Data

US 2013/0257268 A1 Oct. 3, 2013

(30) Foreign Application Priority Data

Mar. 30, 2012 (TW) .............................. 101111301 A

(51) Int. Cl.
*H01L 51/50* (2006.01)
*H01L 51/52* (2006.01)
*H01L 51/54* (2006.01)
*H05B 33/24* (2006.01)

(52) U.S. Cl.
CPC ............ *H05B 33/24* (2013.01); *H01L 51/5265* (2013.01); *H01L 51/5281* (2013.01)
USPC .............................. 313/506; 313/509; 313/512

(58) Field of Classification Search
CPC ............ H01L 51/5281; H01L 27/3244; H01L 27/14678; H01L 27/3211; H01L 27/322; H01L 27/3269; H01L 27/1214; H01L 27/1225; H01L 27/15; H01L 51/524; H01L 51/5253; H01L 51/5293; H01L 51/5265; H01L 27/3248; H01L 27/32; H01L 51/5221; H05B 33/24; F21V 9/14; F21S 48/114; G02B 6/0056; G02B 27/283; G02F 1/13362
USPC .................................................. 313/498–512
See application file for complete search history.

(56) References Cited

U.S. PATENT DOCUMENTS

| | | | |
|---|---|---|---|
| 5,049,780 | A | 9/1991 | Dobrowolski et al. |
| 6,936,960 | B2 | 8/2005 | Cok |
| 2004/0145310 | A1 | 7/2004 | Su et al. |

(Continued)

FOREIGN PATENT DOCUMENTS

TW    I293539    2/2008

OTHER PUBLICATIONS

TW Office Action dated Sep. 15, 2014.

*Primary Examiner* — Nimeshkumar Patel
*Assistant Examiner* — Jose M Diaz
(74) *Attorney, Agent, or Firm* — McClure, Qualey & Rodack, LLP

(57) ABSTRACT

An organic light emitting diode (OLED) display, which includes a first electrode layer, a second electrode layer, an electroluminescent body, a phase shift layer and a metal layer, is disclosed. The electroluminescent body is disposed on the first electrode layer. The second electrode layer is disposed on the electroluminescent body. The phase shift layer has a first surface and a second surface opposite to the first surface. The second electrode layer is disposed on the second surface. The metal layer is disposed on the first surface of the phase shift layer. An environmental incident light enters a surface of the metal layer to form a first reflective light on the first surface and form a second reflective light on the second surface. The first reflective light has a phase difference from the second reflective light.

19 Claims, 2 Drawing Sheets

(56) References Cited

U.S. PATENT DOCUMENTS

| | | | |
|---|---|---|---|
| 2006/0209239 A1* | 9/2006 | Lin | 349/119 |
| 2006/0267485 A1* | 11/2006 | Wood et al. | 313/504 |
| 2008/0012076 A1* | 1/2008 | Yamazaki et al. | 257/347 |
| 2008/0143253 A1* | 6/2008 | Adachi et al. | 313/504 |
| 2010/0019667 A1* | 1/2010 | Park et al. | 313/504 |
| 2010/0072880 A1* | 3/2010 | Adachi et al. | 313/498 |
| 2011/0163333 A1* | 7/2011 | Adachi | 257/88 |
| 2012/0038876 A1* | 2/2012 | Lee et al. | 349/175 |

\* cited by examiner

ORGANIC LIGHT EMITTING DIODE DISPLAY

This application claims the benefit of Taiwan application Serial No. 101111301, filed Mar. 30, 2012, the subject matter of which is incorporated herein by reference.

BACKGROUND OF THE INVENTION

1. Field of the Invention

The invention relates in general to an organic light emitting diode (OLED) display, and more particularly to an OLED display having a phase shift layer and a metal layer.

2. Description of the Related Art

Along with the advance in the display technology, various display products, such as organic light emitting diode (OLED) displays and liquid crystal displays, have gained rapid advance, and higher standards regarding functions and performance of which are expected. OLED displays have become a focus in the research of the display technology. OLED displays have reflective electrodes to enhance the emitting of lights. However, when irradiated by an external environmental incident light, the reflective electrode would act as a mirror which reflects the environmental incident light, and hence the readability of displays is deteriorated. Conventionally, a polarizer is used in the OLED display to reduce the reflection of the environmental incident light, but at the same time, the relative brightness of the display is deteriorated. Therefore, how to provide an OLED display capable of maintaining relative brightness and reducing the reflection of the environmental incident light has become a prominent task.

SUMMARY OF THE INVENTION

The invention is directed to an organic light emitting diode (OLED) display. Via an environmental incident light passing through a metal layer and a phase shift layer disposed on an electrode, the reflection of the environmental incident light is reduced, and therefore the display quality is improved.

According to an embodiment of the present invention, an organic light emitting diode (OLED) display, comprising a first electrode layer, a second electrode layer, an electroluminescent body, a phase shift layer and a metal layer, is provided. The electroluminescent body is disposed on the first electrode layer. The second electrode layer is disposed on the electroluminescent body. The phase shift layer has a first surface and a second surface opposite to the first surface. The second electrode layer is disposed on the second surface. The metal layer is disposed on the first surface of the phase shift layer. An environmental incident light enters a surface of the metal layer to form a first reflective light on the first surface and form a second reflective light on the second surface. The first reflective light has a phase difference from the second reflective light.

The above and other aspects of the invention will become better understood with regard to the following detailed description of the preferred but non-limiting embodiment(s). The following description is made with reference to the accompanying drawings.

DETAILED DESCRIPTION OF THE INVENTION

An organic light emitting diode (OLED) display is disclosed in a number of embodiments below. Via an environmental incident light passing through a metal layer and a phase shift layer disposed on an electrode, the reflection of the environmental incident light is reduced, and therefore the display quality is improved. However, detailed structures disclosed in the embodiments are for illustration purpose only and not for limiting the scope of protection of the invention. Anyone who is skilled in the technology of the invention may make modifications to the arrangements and procedures of the invention to fit actual needs.

Figure 1:
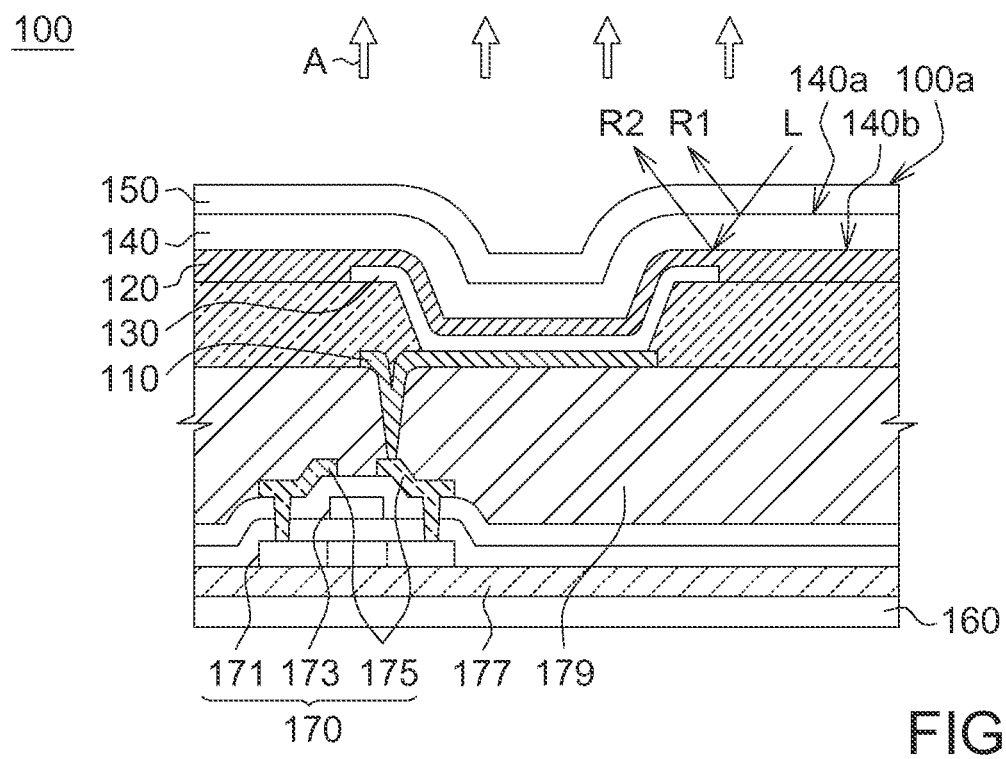
FIG. 1 shows a schematic diagram of an OLED display according to an embodiment of the invention.

Referring to FIG. 1, a schematic diagram of an OLED display according to an embodiment of the invention is shown. The OLED display 100 includes a first electrode layer 110, a second electrode layer 120, an electroluminescent body 130, a phase shift layer 140, and a metal layer 150. The electroluminescent body 130 is disposed on the first electrode layer 110. The second electrode layer 120 is disposed on the electroluminescent body 130. The phase shift layer 140 has a first surface 140a and a second surface 140b opposite to the first surface 140a. The second electrode layer 120 is disposed on the second surface 140b of the phase shift layer 140, and the metal layer 150 is disposed on the first surface 140a of the phase shift layer 140.

As shown in FIG. 1, the second electrode layer 120 is closer to the environmental incident light L outside the display surface 100a of the OLED display 100 than the first electrode layer 110 is. The environmental incident light L enters a surface of the metal layer 150 to form a first reflective light R1 on the first surface 140a and form a second reflective light R2 on the second surface 140b. In the embodiment, the first surface 140a is exemplary an interface between the metal layer 150 and the phase shift layer 140, and the second surface 140b is exemplary an interface between the phase shift layer 140 and the second electrode layer 120. The first reflective light R1 is reflected on the first surface 140a and does not pass through the phase shift layer 140. The second reflective light R2 is reflected on the second surface 140b and passes through the phase shift layer 140. The phase difference between the first reflective light R1 and the second reflective light R2 is between 90~270 degrees and preferably between 135~225 degrees. Optimally, the phase difference is equal to 180 degrees. As such, the destructive interference, which occurs between the first reflective light R1 and the second reflective light R2, reduces the intensity of the entire reflective light, and hence the reflection of the environmental incident light on the display surface 100a of the OLED display 100 is reduced. Consequently, the readability problem of the display surface 100a caused by the excessive reflection of the environmental incident light is improved.

In an embodiment, a refractive index of the phase shift layer 140 is smaller than 1.8, and an extinction coefficient of the phase shift layer 140 is substantially equal to 0. Preferably, the refractive index of the phase shift layer 140 is smaller than 1.5.

A thickness of the phase shift layer 140 may be expressed as: $d = m\lambda/(4 \ast N)$, $N = n - jk$, where d denotes the thickness of the phase shift layer 140, m is an integer, $\lambda$ denotes the wavelength of the environmental incident light L, N denotes the complex refractive index of the phase shift layer 140, n denotes the refractive index of the phase shift layer 140, j is equal to $(-1)^{-1/2}$, and k denotes the extinction coefficient of the phase shift layer 140. In an embodiment, the thickness of the phase shift layer 140 is exemplary between 1400~1800 angstroms (Å). In an embodiment, the phase shift layer 140 is exemplary a water resistant ceramic film formed by such as silicon nitride or silicon oxide. However, the material selections for the phase shift layer 140 are depending on the conditions applied and are not limited to the abovementioned materials.

In an embodiment, the refractive index of the metal layer 150 is between 1~5, and the extinction coefficient of the metal layer 150 is between 2.5~7. Preferably, the refractive index of the metal layer 150 is between 3~5, and the extinction coefficient of the metal layer 150 is between 3~5.

The metal layer 150 is a thin metal layer. That is, the metal layer 150 cannot be too thick for the light to pass through, so as to reach good transmittance needed for the display. If the metal layer 150 is too thick, a mirror effect may occur on the surface of the metal layer 150 adjacent to the environmental incident light, which increases the reflection intensity of the environmental incident light and thus deteriorates the display readability. In an embodiment, the thickness of the metal layer 150 is smaller than or equal to 100 angstroms. Preferably, the thickness of the metal layer 150 is smaller than or equal to 50 angstroms. More preferably, the thickness of the metal layer 150 is between 10~40 angstroms. In an embodiment, the metal layer 150 may be formed of a material selected from a group consisting of chromium (Cr), aluminum (Al), molybdenum (Mo), and a combination thereof. Note that, other materials for the metal layer 150 may be alternatively selected for various applications.

In an embodiment, the metal layer 150 is not electrically connected to any other elements. Alternatively, the metal layer 150 may be electrically connected to other elements for various applications.

The combination of the metal layer 150 with high refractive index and high extinction coefficient and the phase shift layer 140 with low refractive index and low water vapor transmission rate (WVTR) can effectively reduce the reflection of the environmental incident light and increase display readability. The invention is further elaborated in a number of embodiments below. However, the following embodiments are disclosed for exemplary illustrations only and shall not be interpreted for limiting the scope of the invention.

In the following embodiments, a combination of the first electrode layer 110, the phase shift layer 140, and the metal layer 150 is regarded as an environmental incident light absorber. Oppositely, the comparison example is an OLED display without the environmental incident light absorber. The material and thickness conditions of the environmental incident light absorber (the first electrode layer 110, the phase shift layer 140, and the metal layer 150) for Embodiments 1~5 are listed as follows:

(1) Embodiment 1: indium zinc oxide; 800 angstroms (the first electrode layer)/silica, 1400 angstroms (the phase shift layer)/chromium, and 10 angstroms (the metal layer).
(2) Embodiment 2: indium zinc oxide; 800 angstroms (the first electrode layer)/silica, 1400 angstroms (the phase shift layer)/chromium, and 20 angstroms (the metal layer).
(3) Embodiment 3: indium zinc oxide; 800 angstroms (the first electrode layer)/silica, 1400 angstroms (the phase shift layer)/chromium, and 40 angstroms (the metal layer).
(4) Embodiment 4: indium zinc oxide; 800 angstroms (the first electrode layer)/silica, 1800 angstroms (the phase shift layer)/chromium, and 40 angstroms (the metal layer).
(5) Embodiment 5: indium zinc oxide; 800 angstroms (the first electrode layer)/silica, 1800 angstroms (the phase shift layer)/aluminum, and 40 angstroms (the metal layer).

TABLE 1

|  | Comparison Example | Embodiment 1 | Embodiment 2 | Embodiment 3 | Embodiment 4 | Embodiment 5 |
|---|---|---|---|---|---|---|
| Reflectivity (%) | 48.18 | 38.49 | 26.09 | 12.24 | 8.66 | 28.56 |
| Relative Brightness (%) | 100 | 77 | 65 | 47 | 62 | 91 |
| Chroma Coordinate (x, y) | 0.28, 0.38 | 0.29, 0.34 | 0.29, 0.34 | 0.29, 0.33 | 0.24, 0.37 | 0.24, 0.38 |

The experimental results are illustrated in Table 1. For Embodiment 4, the relative brightness still remains at 62%, while the reflectivity of the environmental incident light is greatly reduced from 48.48% (without environmental incident light absorber) to 8.66%. In other words, the reflectivity obtained in Embodiment 4 is largely reduced by 80%. Conventionally, a display is equipped with a polarizer for reducing the reflectivity by way of polarization, however, the relative brightness of which definitely degrades to below 50%. In contrast, in the embodiments of the invention, the reflection of the environmental incident light can be significantly reduced on the basis that the relative brightness of the OLED display 100 equipped with the environmental incident light absorber (the first electrode layer 110, the phase shift layer 140, and the metal layer 150) remains at above 50%.

The OLED display 100 may further include a substrate 160. The first electrode layer 110 is disposed between the substrate 160 and the electroluminescent body 130. The substrate 160 may be exemplary a glass substrate or a flexible substrate but is not limited thereto. The substrate 160 may be formed of a transparent or a non-transparent material.

In an embodiment, the first electrode layer 110 is exemplary an anode, and is preferably a reflective electrode formed of a metal material, which is capable of reflecting lights, whereas the second electrode layer 120 is exemplary a cathode, and is preferably formed of a transparent or translucent electrode to form a top-emitting OLED display. As shown in FIG. 1, the arrow A indicates the direction of light-emission.

In an embodiment, the first electrode layer 110 is exemplary a cathode, and is preferably a reflective electrode formed of a metal material, which is capable of reflecting lights, whereas the second electrode layer 120 is exemplary an anode, and is preferably a transparent or translucent electrode to form an inverted top-emitting OLED display. As shown in FIG. 1, the arrow A indicates the direction of light-emission.

The OLED display 100 may further include a driving element 170, a buffer layer 177, and a planarization layer 179. The driving element 170 may be disposed between the substrate 160 and the first electrode layer 110 and electrically connected to the first electrode layer 110 for driving the electroluminescent body 130 and controlling the electroluminescent body 130 to be turned on/off. As shown in FIG. 1, the driving element 170 includes a semiconductor layer 171, a gate layer 173, and a source/drain layer 175. The semiconductor layer 171, the gate layer 173, and the source/drain layer 175 form a thin film transistor. The buffer layer 177 is disposed between the substrate 160 and the driving element 170, and the planarization layer 179 is disposed between the driving element 170 and the first electrode layer 110.

Figure 2:
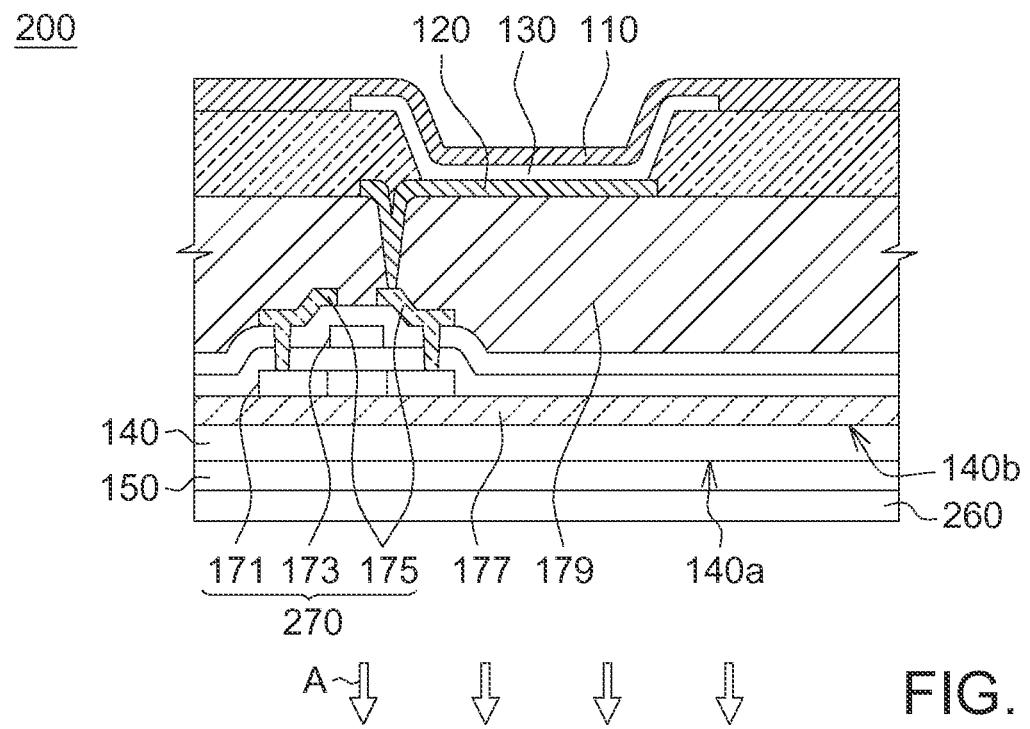
FIG. 2 shows a schematic diagram of an OLED display according to another embodiment of the invention.

Referring to FIG. 2, a schematic diagram of an OLED display according to another embodiment of the invention is shown. The OLED display 200 includes a first electrode layer 110, a second electrode layer 120, an electroluminescent body 130, a phase shift layer 140, and a metal layer 150. The structure, stacking sequence, and function principles of the above elements are similar to those in FIG. 1, and therefore, are not repeated here, and only the differences are illustrated below. The OLED display 200 may further include a substrate 260. The metal layer 150 is disposed between the substrate 260 and the phase shift layer 140. The substrate 260 may be exemplary a glass substrate or a flexible substrate but is not limited thereto. The substrate 260 may be formed of transparent or non-transparent material.

In an embodiment, the first electrode layer 110 is exemplary a cathode, and is preferably a reflective electrode formed of a metal material, which is capable of reflecting lights, whereas the second electrode layer 120 is exemplary an anode, and is preferably a transparent or translucent electrode to form a bottom-emitting OLED display. As shown in FIG. 2, the arrow A indicates the direction of light-emission.

In an embodiment, the first electrode layer 110 is exemplary an anode, and is preferably a reflective electrode formed of a metal material, which is capable of reflecting lights, whereas the second electrode layer 120 is exemplary a cathode, and is preferably a transparent or translucent electrode to form an inverted bottom-emitting OLED display. As shown in FIG. 2, the arrow A indicates the direction of light-emission.

The OLED display 200 may further include a driving element 270, a buffer layer 177, and a planarization layer 179. The driving element 270 may be disposed between the phase shift layer 140 and the second electrode layer 120 and electrically connected to the second electrode layer 120 for driving the electroluminescent body 130 and controlling the electroluminescent body 130 to be turned on/off. In an embodiment, the structure, stacking sequence and function principles of the driving element 270 are similar to those of the driving element 170, and therefore, are not repeated here. The buffer layer 177 is disposed between the phase shift layer 140 and the driving element 270, and the planarization layer 179 is disposed between the driving element 270 and the second electrode layer 120.

In an embodiment, the first surface 140a is such as an interface between the metal layer 150 and the phase shift layer 140, and the second surface 140b is such as an interface between the phase shift layer 140 and the driving element 270.

Figure 3:
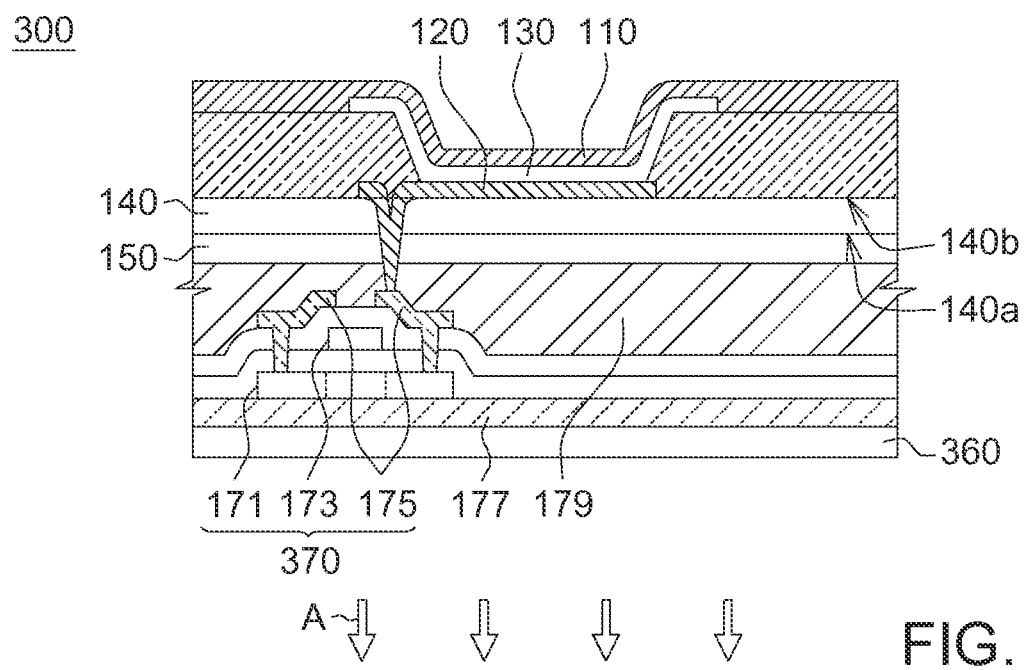
FIG. 3 shows a schematic diagram of an OLED display according to a further embodiment of the invention.

Referring to FIG. 3, a schematic diagram of an OLED display according to a further embodiment of the invention is shown. The OLED display 300 includes a substrate 360, a first electrode layer 110, a second electrode layer 120, an electroluminescent body 130, a phase shift layer 140, and a metal layer 150. The structure, stacking sequence, and function principles of the above elements are similar to those in FIG. 2, and therefore, are not repeated here, and only the differences are illustrated below. The OLED display 300 further includes a driving element 370, a buffer layer 177, and a planarization layer 179. The driving element 370 may be disposed between the substrate 360 and the metal layer 150 and electrically connected to the second electrode layer 120 for driving the electroluminescent body 130 and controlling the electroluminescent body 130 to be turned on/off, wherein, the driving element 370 may be a thin film transistor. The structure, stacking sequence, and function principles of the driving element 370 are similar to those of the driving element 170, and therefore, are not repeated here. The buffer layer 177 is disposed between the substrate 360 and the driving element 370, and the planarization layer 179 is disposed between the driving element 370 and the metal layer 150. In an embodiment, the OLED display 300 is exemplary a bottom-emitting OLED display. As shown in FIG. 3, the arrow A indicates the direction of light-emission.

In an embodiment, the first surface 140a is exemplary an interface between the metal layer 150 and the phase shift layer 140, and the second surface 140b is exemplary an interface between the phase shift layer 140 and the second electrode layer 120.

Figure 4:
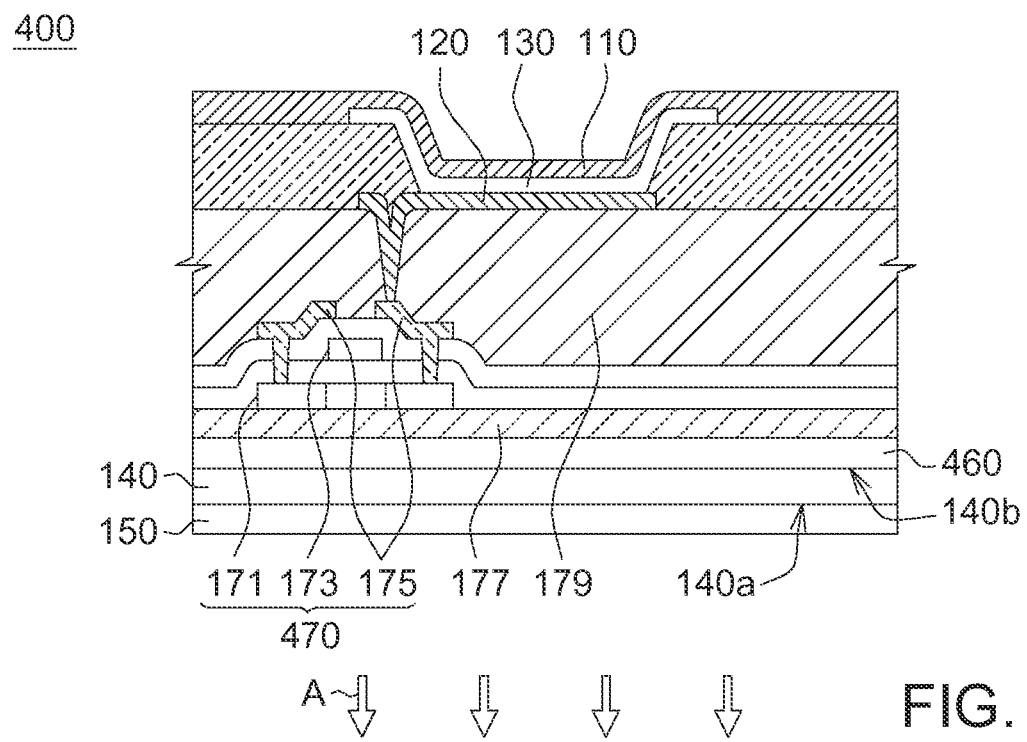
FIG. 4 shows a schematic diagram of an OLED display according to yet another embodiment of the invention.

Referring to FIG. 4, a schematic diagram of an OLED display according to yet another embodiment of the invention is shown. The OLED display 400 includes a first electrode layer 110, a second electrode layer 120, an electroluminescent body 130, a phase shift layer 140 and a metal layer 150. The structure, stacking sequence, and function principles of the above elements are similar to those in FIG. 1, and therefore, are not repeated here, and only the differences are illustrated below. The OLED display 400 further includes a substrate 460 disposed between the phase shift layer 140 and the second electrode layer 120. The substrate 460 is exemplary a glass substrate or a flexible substrate but is not limited thereto. The substrate 460 may be formed of transparent or non-transparent material.

In an embodiment, the first electrode layer 110 is exemplary a cathode and is preferably a reflective electrode formed of a metal material, which is capable of reflecting lights, whereas the second electrode layer 120 is exemplary an anode and is preferably a transparent or translucent electrode to form a bottom-emitting OLED display. As shown in FIG. 4, the arrow A indicates the direction of light-emission.

In an embodiment, the first electrode layer 110 is exemplary an anode and is preferably a reflective electrode formed of a metal material, which is capable of reflecting lights, whereas the second electrode layer 120 is exemplary a cathode and is preferably a transparent or translucent electrode to form an inverted bottom-emitting OLED display. As shown in FIG. 4, the arrow A indicates the direction of light-emission.

The OLED display 400 may further include a driving element 470, a buffer layer 177, and a planarization layer 179. The driving element 470 may be disposed between the substrate 460 and the second electrode layer 120 and electrically connected to the second electrode layer 120 for driving the electroluminescent body 130 and controlling the electroluminescent body 130 to be turned on/off. In an embodiment, the structure, stacking sequence, and function principles of the driving element 470 are similar to those of the driving element 170, and therefore, are not repeated here. The buffer layer 177 is disposed between the substrate 460 and the driving element 470, and the planarization layer 179 is disposed between the driving element 470 and the second electrode layer 120.

In an embodiment, the first surface 140a is exemplary an interface between the metal layer 150 and the phase shift layer 140, and the second surface 140b is exemplary an interface between the phase shift layer 140 and the substrate 460.

According to the OLED display of the above embodiments, via the environmental incident light passing through the metal layer and the phase shift layer disposed on the electrode, the destructive interference occurs between reflective lights, and hence the reflection of the environmental incident light is reduced, so as to improve the display readability and display quality. Moreover, the metal layer is a thin metal layer having an excellent transmittance enabling the light to pass through the display.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic light emitting diode (OLED) display, comprising:
   a first electrode layer;
   an electroluminescent body disposed on the first electrode layer;
   a second electrode layer disposed on the electroluminescent body;
   a phase shift layer having a first surface and a second surface opposite to the first surface, the second electrode layer being disposed on the second surface, wherein the phase shift layer is formed of a water resistant ceramic film; and
   a metal layer disposed on the first surface;
   wherein an environmental incident light enters a surface of the metal layer to form a first reflective light on the first surface and form a second reflective light on the second surface, and the first reflective light has a phase difference from the second reflective light.

2. The OLED display according to claim 1, wherein the phase difference is between 90~270 degrees.

3. The OLED display according to claim 1, wherein the phase difference is between 135~225 degrees.

4. The OLED display according to claim 1, wherein the phase difference is 180 degrees.

5. The OLED display according to claim 1, wherein a refractive index of the phase shift layer is smaller than 1.8.

6. The OLED display according to claim 1, wherein an extinction coefficient of the phase shift layer is substantially equal to 0.

7. The OLED display according to claim 1, wherein a thickness of the phase shift layer is expressed as: $d=m\lambda/(4*N)$, $N=n-jk$;
   wherein d denotes the thickness of the phase shift layer, m denotes an integer, $\lambda$ denotes a wavelength of the environmental incident light, N denotes a complex refractive index of the phase shift layer, n denotes a refractive index of the phase shift layer, j denotes $(-1)^{-1/2}$, and k denotes an extinction coefficient of the phase shift layer.

8. The OLED display according to claim 1, wherein a thickness of the phase shift layer is between 1400~1800 angstroms (A).

9. The OLED display according to claim 1, wherein a refractive index of the metal layer is between 1~5.

10. The OLED display according to claim 1, wherein an extinction coefficient of the metal layer is between 2.5~7.

11. The OLED display according to claim 1, wherein a thickness of the metal layer is smaller than or equal to 100 angstroms.

12. The OLED display according to claim 1, wherein the metal layer is formed of a material selected from a group consisting of chromium (Cr), aluminum (Al), molybdenum (Mo), and a combination thereof.

13. The OLED display according to claim 1, further comprising a substrate, wherein the first electrode layer is disposed between the substrate and the electroluminescent body.

14. The OLED display according to claim 13, further comprising a driving element disposed between the substrate and the first electrode layer and electrically connected to the first electrode layer.

15. The OLED display according to claim 1, further comprising a substrate, wherein the metal layer is disposed between the substrate and the phase shift layer.

16. The OLED display according to claim 15, further comprising a driving element disposed between the substrate and the metal layer and electrically connected to the second electrode layer.

17. The OLED display according to claim 15, further comprising a driving element disposed between the phase shift layer and the second electrode layer and electrically connected to the second electrode layer.

18. The OLED display according to claim 1, further comprising a substrate disposed between the phase shift layer and the second electrode layer.

19. The OLED display according to claim 18, further comprising a driving element disposed between the substrate and the second electrode layer and electrically connected to the second electrode layer.

* * * * *